US012660075B2

(12) United States Patent
Lee et al.

(10) Patent No.: US 12,660,075 B2
(45) Date of Patent: Jun. 16, 2026

(54) PLASMA GENERATION UNIT AND PLASMA TREATMENT APPARATUS

(71) Applicant: FEAGLE CO., LTD, Yangsan-si (KR)

(72) Inventors: Hyunyoung Lee, Yangsan-si (KR); Eunji An, Yangsan-si (KR); Intae Kim, Yangsan-si (KR); Jeonghae Choi, Busan (KR)

(73) Assignee: FEAGLE CO., LTD, Yangsan-si (KR)

( * ) Notice: Subject to any disclaimer, the term of this patent is extended or adjusted under 35 U.S.C. 154(b) by 966 days.

(21) Appl. No.: 17/800,893

(22) PCT Filed: Oct. 13, 2020

(86) PCT No.: PCT/KR2020/013911
§ 371 (c)(1),
(2) Date: Aug. 18, 2022

(87) PCT Pub. No.: WO2021/172685
PCT Pub. Date: Sep. 2, 2021

(65) Prior Publication Data
US 2023/0084380 A1     Mar. 16, 2023

(30) Foreign Application Priority Data

Feb. 27, 2020    (KR) ........................ 10-2020-0024317
Sep. 29, 2020    (KR) ........................ 10-2020-0126647

(51) Int. Cl.
*H05H 1/34*          (2006.01)
*H01J 37/32*         (2006.01)
(52) U.S. Cl.
CPC ........... *H05H 1/34* (2013.01); *H01J 37/3244* (2013.01)
(58) Field of Classification Search
CPC ...... H05H 1/34; H05H 2245/34; H05H 1/245; H01J 37/3244; H01J 37/00; A61N 1/44
See application file for complete search history.

(56) References Cited

U.S. PATENT DOCUMENTS

| | | | | |
|---|---|---|---|---|
| 3,562,486 A | * | 2/1971 | Hatch | .................. H05H 1/3405 |
| | | | | 219/121.45 |
| 6,163,008 A | * | 12/2000 | Roberts | .................... H05H 1/34 |
| | | | | 219/121.48 |

(Continued)

FOREIGN PATENT DOCUMENTS

| | | |
|---|---|---|
| JP | 11-285835 A | 10/1999 |
| KR | 10-2003-0077369 A | 10/2003 |

(Continued)

OTHER PUBLICATIONS

International Search Report in International Application No. PCT/KR2020/013911, dated Jan. 18, 2021, 3pages.

*Primary Examiner* — Dung T Ulsh
*Assistant Examiner* — Fatimata Sahra Diop
(74) *Attorney, Agent, or Firm* — Park, Kim & Suh, LLC

(57)          ABSTRACT

The present invention discloses a plasma generation unit and a plasma treatment apparatus, the plasma generation unit including a first electrode part that includes a body having an insertion hole therein and having an insulation property and a conductive member disposed on an outer circumferential surface of the body, and a second electrode part that has a gas injection hole communicating with one end thereof, has another end region inserted into the insertion hole of the first electrode part, and has a conductive property, wherein the another end region of the second electrode part has a diameter that is decreased toward the other end and is located to correspond to an arrangement region of the conductive member.

15 Claims, 8 Drawing Sheets

(56)                    References Cited

U.S. PATENT DOCUMENTS

| | | |
|---|---|---|
| 2011/0301412 A1 | 12/2011 | Cho |
| 2012/0152913 A1* | 6/2012 | Mather .................... H05H 1/34 |
| | | 219/121.52 |
| 2014/0087587 A1* | 3/2014 | Lind .................... H01R 13/434 |
| | | 439/527 |
| 2019/0083161 A1 | 3/2019 | Harle et al. |

FOREIGN PATENT DOCUMENTS

| | | |
|---|---|---|
| KR | 10-0723019 B1 | 5/2007 |
| KR | 10-0723919 B1 | 8/2007 |
| KR | 10-0807806 B1 | 2/2008 |
| KR | 10-0828590 B1 | 5/2008 |
| KR | 10-2011-0134255 A | 12/2011 |
| KR | 10-1171092 B1 | 8/2012 |
| KR | 10-1579787 B1 | 12/2015 |
| KR | 10-1968709 B1 | 4/2019 |

* cited by examiner

PLASMA GENERATION UNIT AND PLASMA TREATMENT APPARATUS

CROSS-REFERENCE TO RELATED APPLICATIONS

This application is the National Stage filing under 35 U.S.C. 371 of International Application No. PCT/KR2020/013911, filed on Oct. 13, 2020, which claims the benefit of Korean Patent Application No. 10-2020-0024317, filed on Feb. 27, 2020, and Korean Patent Application No. 10-2020-0126647, filed on Sep. 29, 2020, the contents of which are all hereby incorporated by reference herein in their entirety.

TECHNICAL FIELD

The present invention relates to a plasma generation unit and a plasma treatment apparatus.

BACKGROUND ART

A conventional atmospheric pressure plasma gas generation device includes a plate (an electrode plate) and a center electrode connected to a power supply line for plasma generation and an insulator for preventing a short circuit between the plate and the center electrode and is provided with a gas supply pipe for emitting a plasma gas.

Korean Patent No. 10-0828590, Korean Patent No. 10-0807806, and Korean Patent No. 10-0723019 are representative related arts of the technology, and the technology is advantageous for welding or surface treatment of a processed product by emitting plasma in a jet form but is not suitable for surface treatment of medical devices or medical tools for treatment of a human body.

An atmospheric pressure plasma generation device according to the related art has a problem that, as plasma is generated while the atmospheric pressure plasma generation device is formed integrally with a center electrode and an insulator and a gap of a certain distance is maintained between plates, the plasma generation locations are situated in the plates, and thus the thin plates are easily damaged or broken due to a high temperature, and the atmospheric pressure plasma generation device cannot be used for a long time.

DETAILED DESCRIPTION OF THE INVENTION

Technical Problem

The purpose of the present invention is to provide a plasma generation unit and a plasma treatment apparatus that may be in direct contact with a human body for human treatment or stably generate a plasma gas for surface treatment of a medical tool and in which a plasma flame is not emitted to the outside.

The purpose of the present invention is to provide a plasma generation unit and a plasma treatment apparatus capable of minimizing arc discharge and an ozone generation amount.

Meanwhile, the aspects to be achieved in the present invention are not limited to the aspects described above, and those skilled in the art to which the present invention pertains will clearly understand other aspects not described from the following description.

Technical Solution

An aspect of the present invention provides a plasma generation unit including a first electrode part that includes a body having an insertion hole therein and having an insulation property and a conductive member disposed on an outer circumferential surface of the body, and a second electrode part that has a gas injection hole communicating with one end thereof, has another end region inserted into the insertion hole of the first electrode part, and has a conductive property, wherein the another end region of the second electrode part may have a diameter that is decreased toward the other end and may be located to correspond to an arrangement region of the conductive member.

Further, the body may include an electrode region located on one side thereof and a stepped region located on the other side of the electrode region, having a step with the electrode region, and having an expanded diameter, and the conductive member may be disposed on an outer circumferential surface of the electrode region and a stepped surface of the stepped region forming a step with the electrode region.

Further, the conductive member may include a first conductive member disposed on the stepped surface forming a step with the electrode region and a second conductive member disposed on the outer circumferential surface of the electrode region and electrically connected to the first conductive member.

Further, the other end of the second electrode part may be located inside the electrode region.

Further, the other end of the second electrode part may have a conical shape.

Further, the second electrode part may include a flange having an expanded diameter between the one end and the other end, and the plasma generation unit may further include a sealing member disposed between the flange and the one end of the body.

Further, the plasma generation unit may further include a first terminal electrically connected to the conductive member of the first electrode part, and a second terminal electrically connected to the second electrode part.

Further, the first terminal may be in contact with the first conductive member and may be spaced apart from the second conductive member.

A gas discharge hole communicating with the gas injection hole may be formed in an outer circumferential surface of the second electrode part, and the gas discharge hole may communicate with the insertion hole.

Meanwhile, another aspect of the present invention provides a plasma treatment apparatus including a base, at least two plasma generation units each including a first electrode part that includes a body having an insertion hole therein and having an insulation property and a conductive member disposed on an outer circumferential surface of the body and a second electrode part that has a gas injection hole communicating with one end thereof, has another end region inserted into the insertion hole of the first electrode part, and has a conductive property, the at least two plasma generation units being fixed to the base, a first terminal that connects the conductive members of the at least two plasma generation units in parallel and is fastened to the base to prevent separation of the first electrode part, a holder that is fastened to the first terminal, and covers the first electrode part and exposes one end of the second electrode part in each of the at least two plasma generation units, and a second terminal that connects the second electrode parts of the at least two plasma generation units in parallel and is fastened to the holder to prevent separation of the second electrode part, wherein in each of the at least two plasma generation units, the another end region of the second electrode part may have a diameter that is decreased toward the other end and may be located to correspond to an arrangement region of the conductive member.

Further, in each of the at least two plasma generation units, the holder may allow a central line of the insertion hole and a central line of the second electrode part to coincide with each other and space an outer circumferential surface of the second electrode part inserted into the insertion hole and an inner circumferential surface of the first electrode part apart from each other.

Further, in each of the at least two plasma generation units, the body may include an electrode region located on one side thereof and a stepped region located on the other side of the electrode region, having a step with the electrode region, and having an expanded diameter, and the conductive member may include a first conductive member disposed on a stepped surface of the stepped region forming the step with the electrode region and a second conductive member disposed on an outer circumferential surface of the electrode region and electrically connected to the first conductive member.

Further, the other end of the second electrode part may be located inside the electrode region.

Further, in each of the at least two plasma generation units, the second electrode part may include a flange having an expanded diameter between the one end and the other end, and each of the at least two plasma generation units may further include a sealing member disposed between the flange and the one end of the body.

Further, the first terminal may be in contact with the first conductive member and may be spaced apart from the second conductive member.

Advantageous Effects of the Invention

A plasma generation unit and a plasma treatment apparatus according to an embodiment of the present invention can be in direct contact with a human body for human treatment or stably generate a plasma gas for surface treatment of a medical tool and may not emit a plasma flame the outside.

Further, the plasma generation unit and the plasma treatment apparatus can minimize arc discharge and an ozone generation amount.

Meanwhile, the effects obtained in the present invention are not limited to the effects described above, and other effects not described will be clearly understood by those skilled in the art to which the present invention pertains from the following description.

BEST MODE

Figure 1:
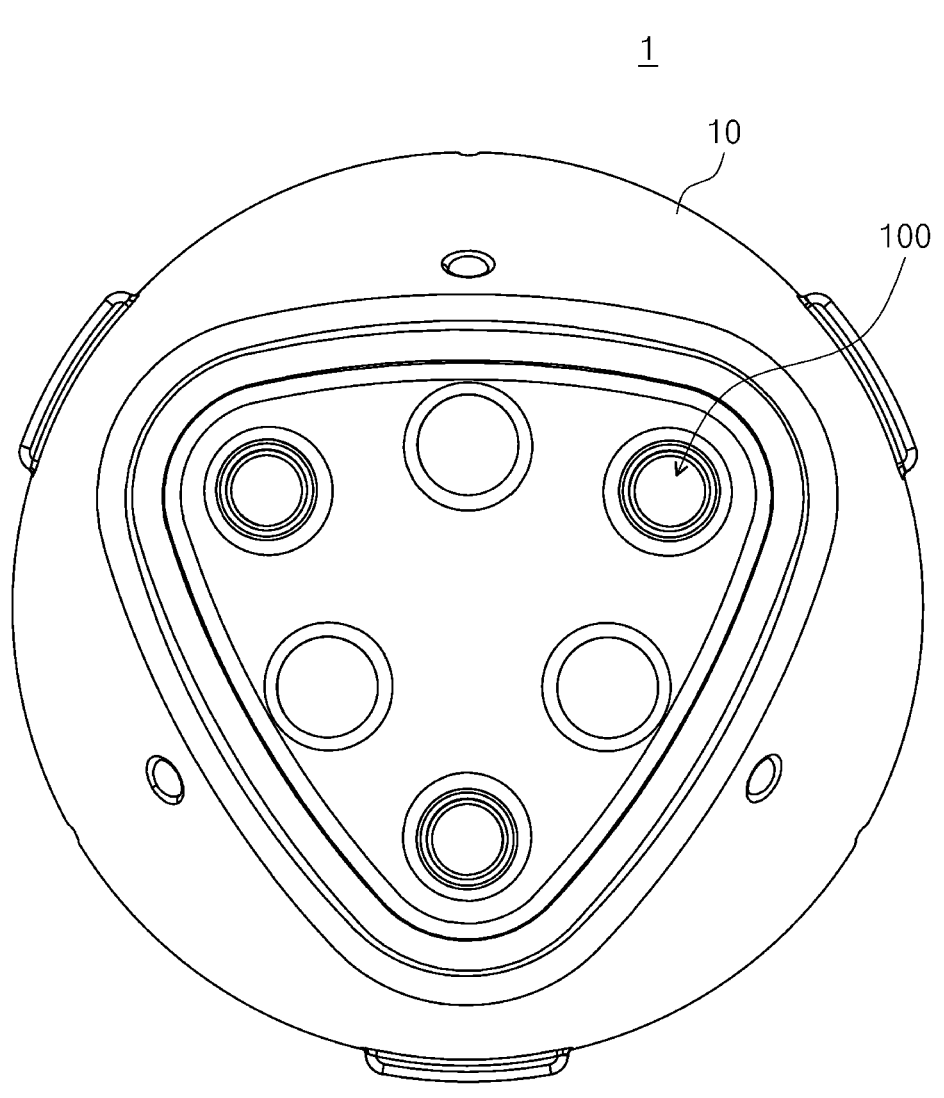
FIG. 1 is a perspective view illustrating a plasma treatment apparatus according to an embodiment of the present invention when viewed from a plasma ejection side.
Figure 2:
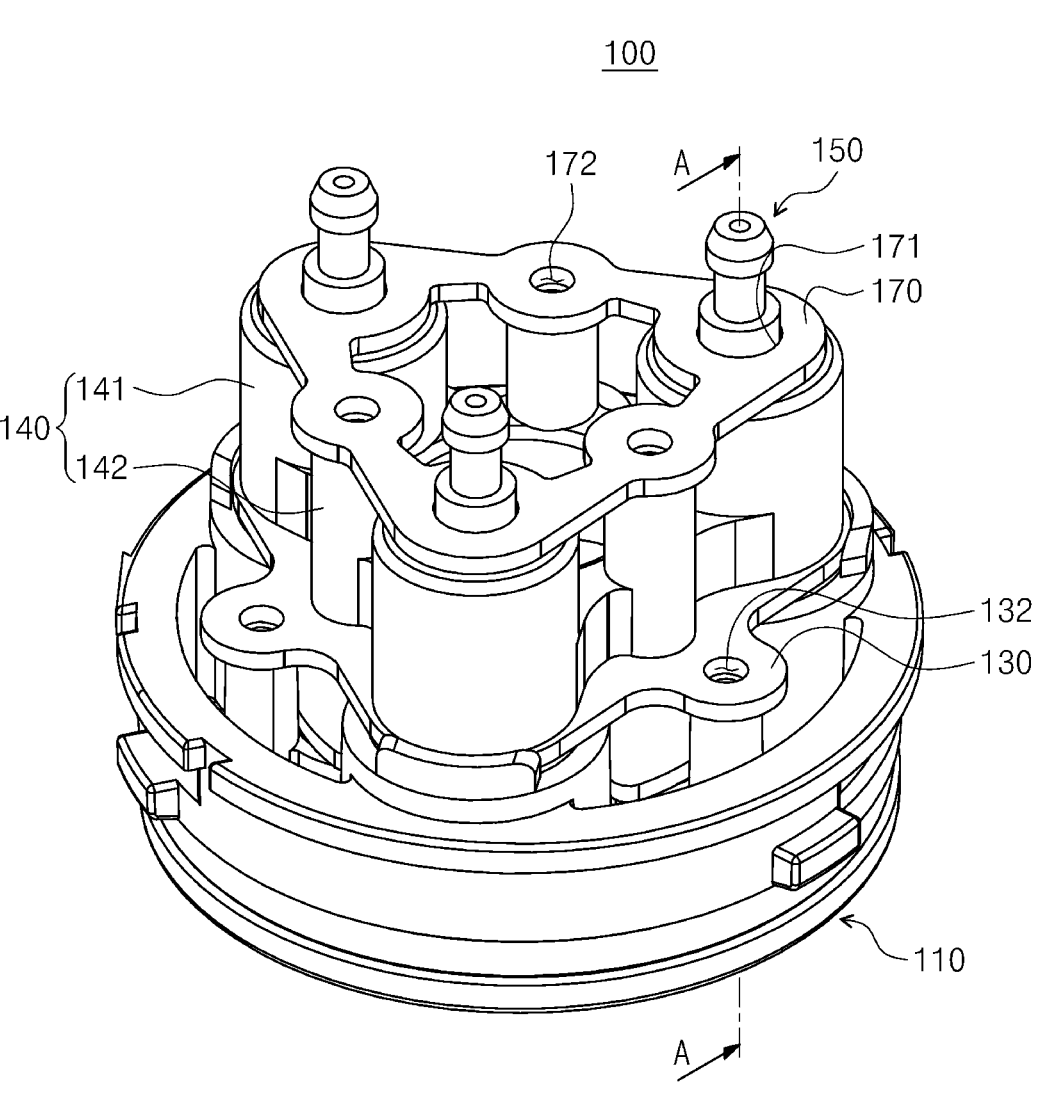
FIG. 2 is a perspective view illustrating an internal configuration of the plasma treatment apparatus according to an embodiment of the present invention.
Figure 3:
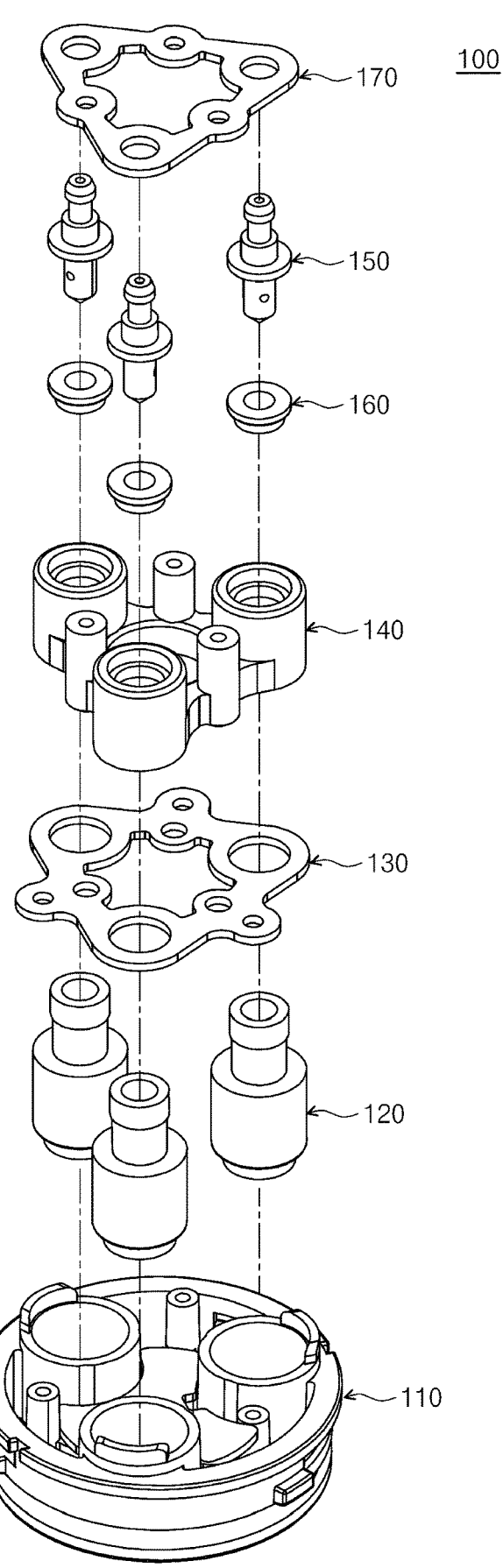
FIG. 3 is an exploded view illustrating the internal configuration of the plasma treatment apparatus according to an embodiment of the present invention.
Figure 4:
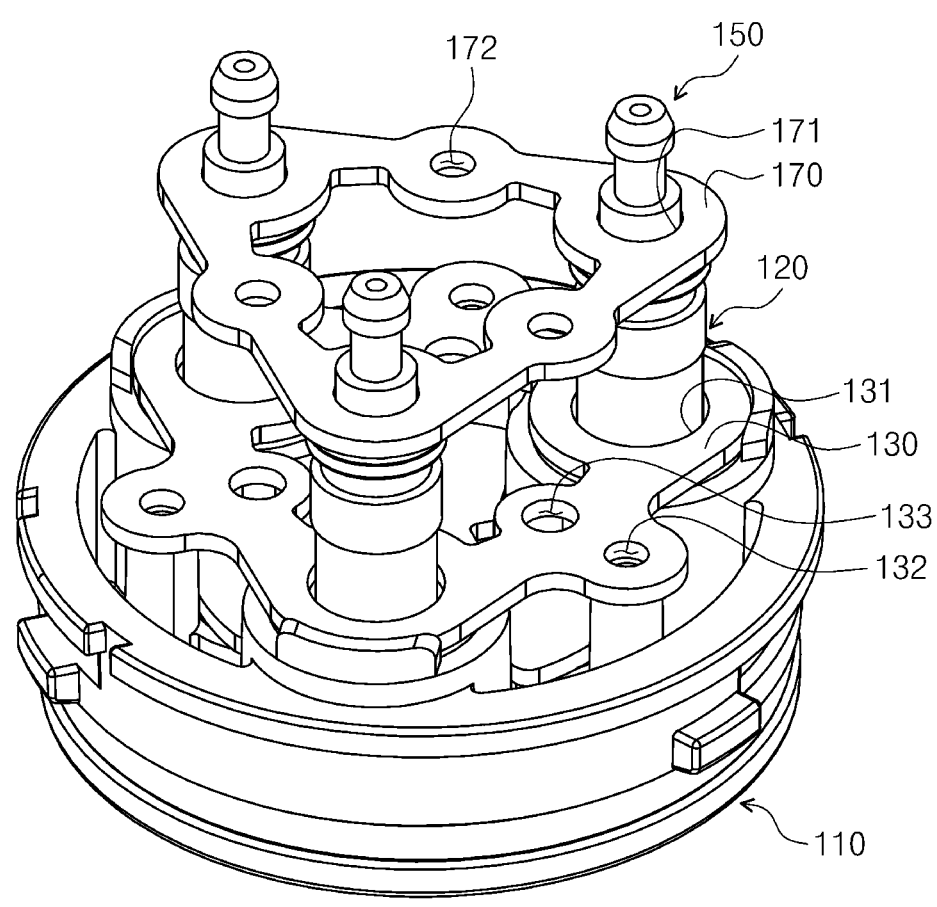
FIG. 4 is a perspective view illustrating a state in which a holder is removed in FIG. 2.
Figure 5:
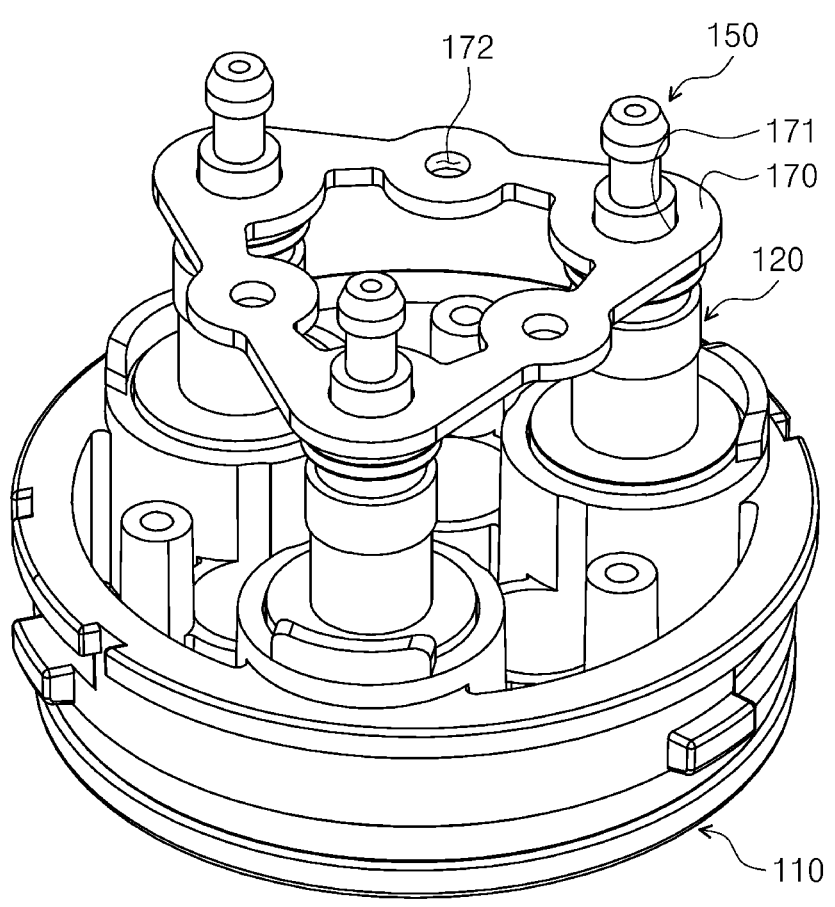
FIG. 5 is a perspective view illustrating a state in which a first electrode is removed in FIG. 4.

Hereinafter, embodiments of the present invention will be described in more detail with reference to the accompanying drawings. The embodiments of the present invention may be modified into various forms, and the scope of the present invention should not be construed to be limited to the following embodiments. The present embodiments are provided to describe the present invention for those skilled in the art more completely. Thus, the shapes of the components of the drawings are exaggerated to emphasize a clearer description thereof.

It should be noted in advance that a configuration of the invention for clarifying the solution of the problem to be solved by the present invention will be described in detail with reference to the accompanying drawings on the basis of an exemplary embodiment of the present invention, the same reference numerals are assigned to the same components even though the components are in different drawings in assigning reference numerals to components of the drawings, and components in other drawings may be cited when necessary in the description of the drawings.

To clearly describe the present invention, parts (a gas supply pipe, an electric circuit, and a controller) irrelevant to the description are omitted, and the same reference numerals are assigned to the same or similar components throughout the specification.

First, referring to FIG. 1, a plasma treatment apparatus 1 according to an embodiment of the present invention may include a case 10 and a plasma generation device 100 installed inside the case 10 and disposed toward a plasma ejection side.

Meanwhile, as an embodiment, the plasma treatment apparatus 1 according to an embodiment of the present invention may be used for a medical device disinfection chamber, oral treatment, tooth whitening, tartar removal, an implant fixture surface regeneration device, scalp treatment, and skin treatment.

The case 10 is implemented to be easily disassembled and assembled and may protect the plasma generation device 100, the gas supply pipe, the electric circuit, and the controller installed therein.

Referring to FIGS. 2 to 8, the plasma generation device 100 may have a structure in which at least two plasma generation units are fixed and then connected in parallel.

Hereinafter, the description of "at least two" may be defined as "plural."

The plasma generation device 100 may include a base 110, a first electrode part 120, a first terminal 130, a holder 140, a second electrode part 150, a sealing member 160, and a second terminal 170.

Here, the first electrode part 120, the first terminal 130, the second electrode part 150, the sealing member 160, and the second terminal 170 may be configured as a plasma generation unit.

The base 110 may be coupled through fitting or fastening to the plasma ejection side inside the case 10.

The base 110 may have an insertion hole for fixing a plurality of plasma generation units, the first electrode part 120 may be inserted into and fixed to one side of the insertion hole of the base 110, and generated plasma may be ejected toward the other side of the insertion hole of the base 110.

The first electrode part 120 may include a body 121, an insertion hole 122, and a conductive member 123. Meanwhile, hereinafter, the body 121 will be described as the first body 121 to be distinguished from a conductive body 151 of the second electrode part 150.

It is preferable that the first body 121 is made of an insulating material or is made of heat-resistant plastic or ceramic material having excellent insulation and high dielectric constant and having excellent thermal conductivity, excellent heat resistance, and excellent corrosion resistance to efficiently generate plasma.

It is preferable that the insertion hole 122 is formed to pass from one side (an upper side in FIG. 6) to the other side (a lower side in FIG. 6) of the first body 121 and is formed in a cylindrical shape. That is, the first body 121 may include an inner circumferential surface formed along the insertion hole 122.

Figure 6:
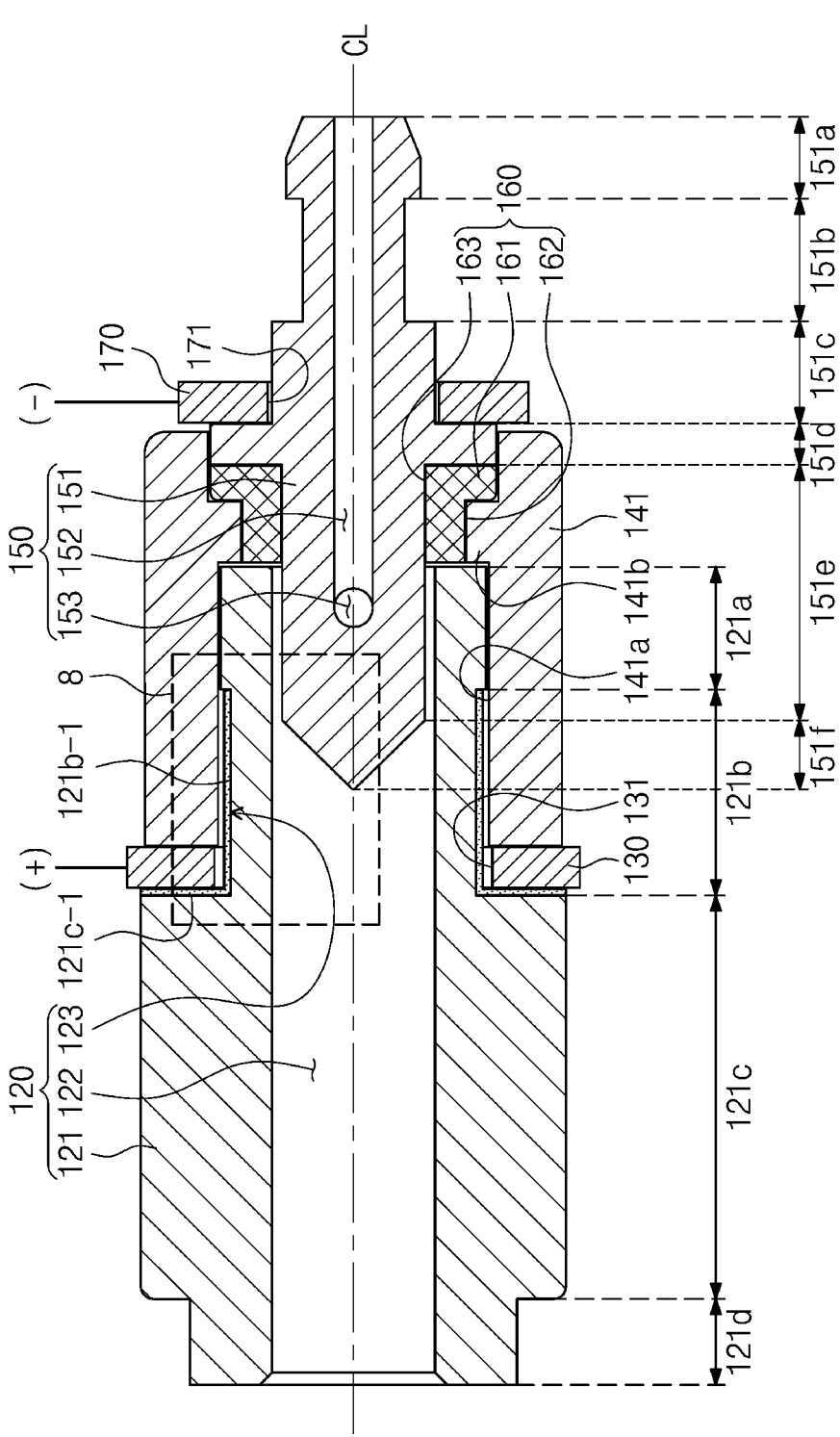
FIG. 6 is a cross-sectional view illustrating a plasma generation unit in a state cut along line A-A' of FIG. 2.
Figure 7:
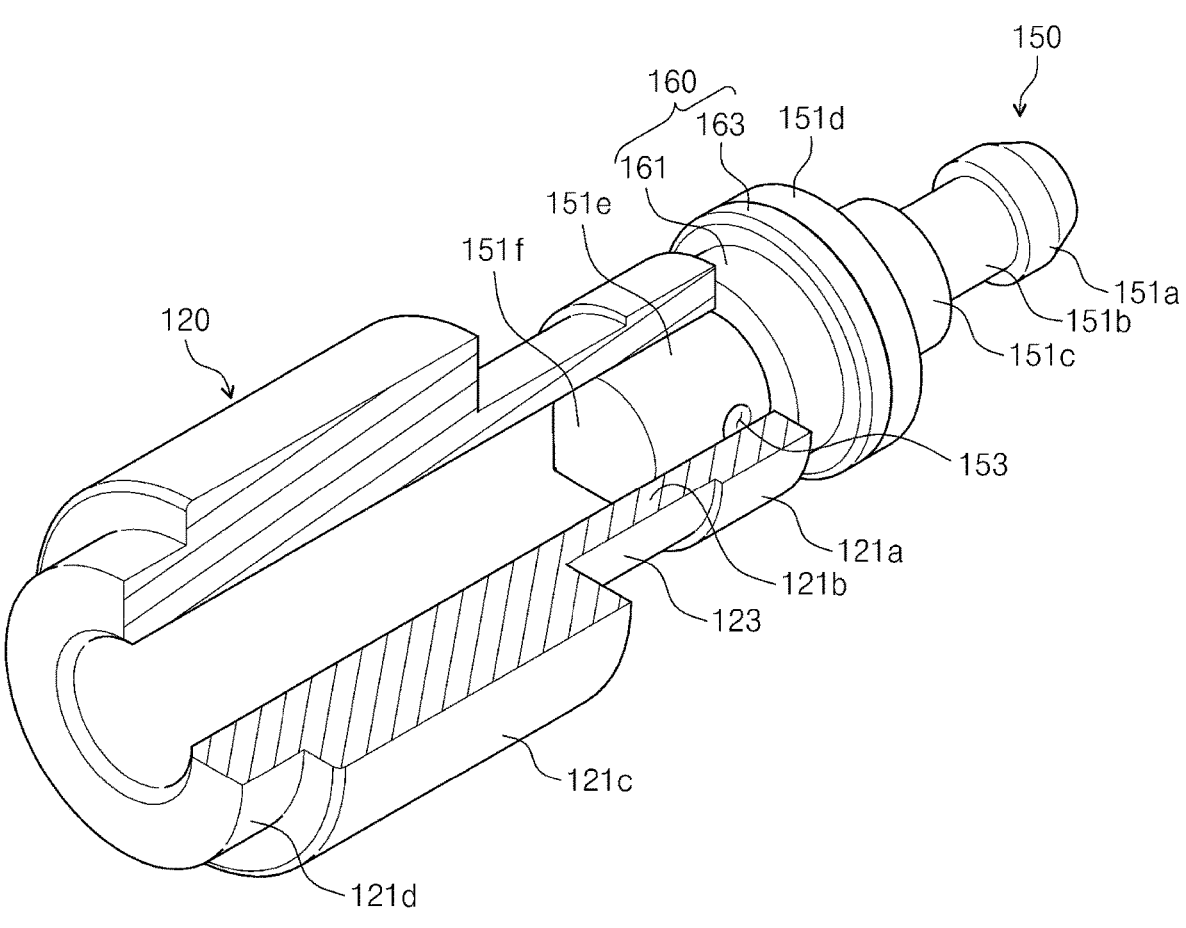
FIG. 7 is a perspective view illustrating a state in which a part of a first electrode part is removed from the plasma generation unit according to an embodiment of the present invention.
Figure 8:
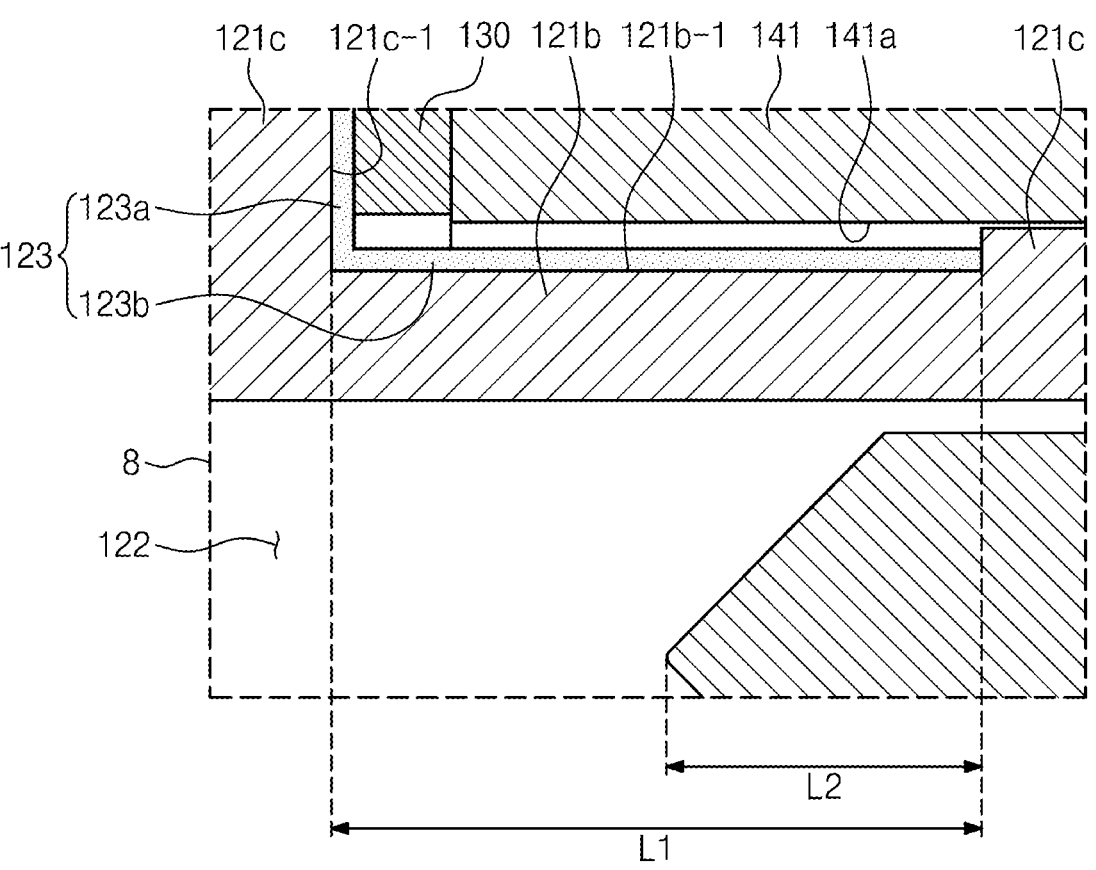
FIG. 8 is an enlarged view of a portion "8" of FIG. 6.

Meanwhile, referring to FIGS. 6 to 8, the first body 121 may include a first region 121a, a second region (electrode region) 121b, a third region (stepped region) 121c, and a fourth region 121b arranged from one side to the other side thereof.

The first region 121a may be located on one side of the first body 121 and may be configured in a cylindrical shape.

The second region (electrode region) 121b may be located on the other side of the first region 121a, may be formed in a cylindrical shape, and may have a smaller diameter than the diameter of the first region 121a. That is, a step may be formed between the second region 121b and the first region 121a.

The third region (stepped region) 121c may be located on the other side of the second region 121b and may form a step with the second region (electrode region) 121b. The third region 121c may be formed in a cylindrical shape and have a larger diameter than the diameter of the second region 121b. That is, a step may be formed between the third region 121c and the second region 121b.

Here, the third region 121c may have a larger diameter than the diameter of the first region 121a, may be a region having the largest diameter in the first body 121, and may function as a region for reinforcing the strength of the first body 121.

The fourth region 121d may be located on the other side of the third region 121c, may be formed in a cylindrical shape, and may have a smaller diameter than the diameter of the third region 121c. That is, a step may be formed between the fourth region 121d and the third region 121c.

Here, the third region 121c and the fourth region 121d are regions inserted into the base 110, and the first body 121 may not be separated to the other side of the base 110 due to the step between the third region 121c and the fourth region 121d.

It is preferable that the conductive member 123 is made of an electrically conductive material, a material that is light and has a stable electric signal is suitable for the conductive member 123, and examples of the material include chrome, stainless steel, nickel, copper, brass, vanadium, titanium, cobalt, platinum, gold, silver, and alloys thereof, but the present invention is not limited thereto.

The conductive member 123 has a thin film shape and may be disposed on one surface 121c-1 of the third region 121c and an outer circumferential surface 121b-1 of the second region 121b.

Here, it is preferable that the conductive member 123 is deposited and formed on the one surface 121c-1 of the third region 121c and the outer circumferential surface 121b-1 of the second region 121b through a high temperature thermal spraying method, a plating method, a vacuum deposition method, a cathode sputtering method, or the like according to a surface material of the first body 121.

The conductive member 123 may include a first conductive member 123a formed on the stepped surface corresponding to the one surface 121c-1 of the third region (stepped region) 121c forming a step with the second region (electrode region) 121b and a second conductive member 123b formed on the outer circumferential surface 121b-1 of the second region 121b and electrically connected to the first conductive member 123a.

Here, it is preferable that the maximum height (the diameter) of the second conductive member 123b formed on the second region 121b is formed to be smaller than the height (the diameter) of the first region 121a.

The first terminal 130 may be fastened to the base 110 to prevent the plurality of first electrode parts 120 from being separated to one side and may electrically connect the plurality of first electrode parts 120 in parallel.

The first terminal 130 may include a terminal hole 131 in which the first electrode part 120 is fitted, a fastening hole 132 to be fastened to the base 110, and a fastening hole 133 to which the holder 140 is to be fastened.

Here, a first voltage (for example, a + voltage) may be applied to the first terminal 130.

Meanwhile, the inner diameter of the terminal hole 131 may be formed to be greater than the diameters of the first region 121a and the second region 121b, and the first region 121a and the second region 121b may pass through the terminal hole 131.

Here, the first terminal 130 may be physically spaced apart from the second conductive member 123b. That is, the voltage applied to the first terminal 130 may be applied to the second conductive member 123b through the first conductive member 123a.

Further, since the inner diameter of the terminal hole 131 is formed to be smaller than the diameter of the third region 121c, the other surface of the first terminal 130 may be in direct contact with the first conductive member 123a, and the other surface of the first terminal 130 may press the one surface 121c-1 of the third region 121c in the other direction by fastening the fastening hole 132.

The holder 140 may be fastened to the first terminal 130, may cover the plurality of first electrode parts 120, and expose one end of the second electrode part 150 to one side.

It is preferable that the holder 140 is made of lightweight heat-resistant plastic, or the like and may include a cover part 141 surrounding the first electrode part 120 and a fastening part 142 to be fastened to the first terminal 130.

Referring to FIGS. 6 and 7, the cover part 141 may include a first accommodation region 141a accommodating the first region 121a and the second region 121b of the first body 121, a catching region 141b protruding inward from the first accommodation region 141a so that one surface of the first region 121a of the first body 121 is caught by the catching region 141b, and a second accommodation region 141c in which a flange 151d of the second electrode part 150 and the sealing member 160 are accommodated.

For fastening to the first terminal 130, the fastening part 142 may include a screw hole (not shown) in which a screw thread is formed.

A bolt for fastening to the fastening part 142 may be inserted into the fastening hole 133 of the first terminal 130.

Meanwhile, the cover part 141 of the holder 140 may space the inner circumferential surface of the first body 121 of the first electrode part 120 and an outer circumferential surface of the second electrode part 150 apart from each other and may align the first electrode part 120 and the second electrode part 150 so that a central line CL of the first electrode part 120 and a central line CL of the second electrode part 150 coincide with each other.

Here, when the central lines CL (having the same center) of the first electrode part 120 and the second electrode part 150 do not coincide with each other and are misaligned, a plasma channeling phenomenon occurs in the insertion hole 122 when a voltage is applied, and thus uniform plasma cannot be generated.

The second electrode part 150 may include a body 151, a gas injection hole 152, and a gas discharge hole 153.

Meanwhile, referring to FIGS. 6 to 8, the second body 151 may include a first region 151*a*, a second region 151*b*, a third region 151*c*, a fourth region 151*d*, a fifth region 151*e*, and a sixth region 151*f* arranged from one side to the other side thereof.

The first region 151*a* may be located on one side of the second body 151 and may be configured in a cylindrical shape. Meanwhile, it is preferable that one end of the first region 151*a* is tapered so that the gas supply pipe may be fitted therein.

The second region 151*b* may be located on the other side of the first region 151*a*, may be formed in a cylindrical shape, and may have a smaller diameter than the diameter of the first region 151*a*. That is, a step may be formed between the second region 151*b* and the first region 151*a*, and the fitted gas supply pipe can be prevented from being separated due to the step between the second region 151*b* and the first region 151*a*.

The third region 151*c* may be located on the other side of the second region 151*b*, may be formed in a cylindrical shape, and may have a larger diameter than the diameter of the second region 151*b*. That is, a step may be formed between the third region 151*c* and the second region 151*b*.

Here, the third region 151*c* may function as a region for reinforcing the strength of the second body 151, and the third region 151*c* may be fitted in a terminal hole 171 of the second terminal 170.

The fourth region 151*d* may be located on the other side of the third region 151*c*, may be formed in a cylindrical shape, may have a larger diameter than the diameter of the third region 151*c*, and may be configured as a flange in the second body 151.

The fifth region 151*e* may be located on the other side of the fourth region 151*d*, may be formed in a cylindrical shape, and may have a smaller diameter than the diameter of the fourth region 151*d*, and a partial region on the other side thereof may be inserted into the insertion hole 122 of the first electrode part 120.

Here, the fifth region 151*e* of the second body 151 may have a diameter in which an outer circumferential surface of the fifth region 151*e* is spaced apart from the inner circumferential surface of the first body 121, and as a result, a space through which a gas flows may be formed. That is, the outer circumferential surface of the fifth region 151*e* inserted into the insertion hole 122 may be spaced apart from the inner circumferential surface of the first body 121.

The sixth region 151*f* may be located on the other side of the fifth region 151*e*, may be formed in a "conical" shape of which the diameter is gradually decreased toward the other end, and may be defined as the other end region of the second body 151.

That is, the other end of the second body 151 has a sharp tip, a charge concentration phenomenon occurs, an electric filed in the sixth region 151*f* becomes the strongest, and accordingly, a voltage for generating plasma can be reduced.

Thus, even with the same voltage, the plasma density may be further increased as compared to an electrode having a blunt end, and a discharge start voltage that is a voltage at which the plasma occurs can be reduced. Further, in the sixth region 151*f*, since an area (a tapered inclined surface) in which the plasma may occur is increased due to the tapered tip, the amount of the plasma generated can be increased.

Figure 9A:
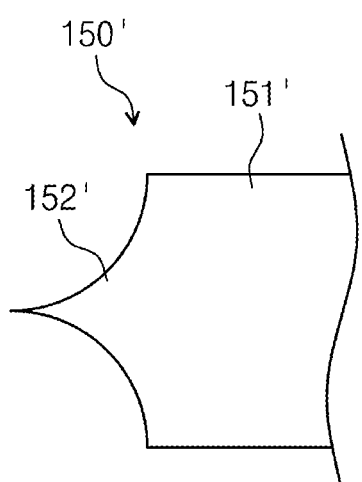
FIG. 9 is an exemplary view schematically illustrating an end region of a second electrode part in a plasma generation unit according to another embodiment of the present invention.

Meanwhile, referring to FIG. 9A, in another embodiment, in a second electrode part 150', another end region 152' extending from a body 151' to the other side may have a shape in which the diameter thereof is smoothly decreased like an exponential function toward the other side, and the other end of the other end region 152' may form a sharp tip in the form of a pin.

Figure 9B:
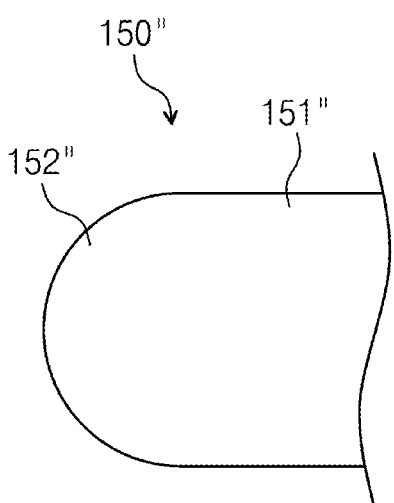

Further, referring to FIG. 9B, in another embodiment, in a second electrode part 150", another end region 152" extending from a body 151" to the other side may have a shape in which the diameter thereof is rapidly decreased like a log function toward the other side, and the other end region 152" may have a hemispherical shape.

The gas injection hole 152 may be formed to pass through one end of the second body 151 to the other side.

Here, it is preferable that the gas injection hole 152 is formed to extend from the one end of the second body 151 to the fifth region 151*e* of the second body 151.

Meanwhile, a gas supplied through the gas supply pipe may be supplied to the plasma generation unit through the gas injection hole 152. Here, it is preferable that the supplied gas is an inert gas such as helium, neon, argon, or nitrogen, the inert gas flows as a plasma discharge gas, and thus a discharge voltage can be reduced to reduce a risk of arc generation.

The gas discharge hole 153 may be formed on the outer circumferential surface of the fifth region 151*e* of the second body 151 so that the other side thereof communicates with the insertion hole 122 in the second region 121*b* and may have one side communicating with the gas injection hole 152.

Through this, the inert gas injected to the gas injection hole 152 may be introduced into the insertion hole 122 through the gas discharge hole 153, and a plasma gas may be formed through the inert gas together with the plasma generated between the first electrode part 120 and the second electrode part 150 in the second region 121*b* of the first body 121 and may be ejected to the other side of the insertion hole 122.

It is preferable that the sixth region 151*f* is located inside the second region 121*b* of the first body 121, and it is more preferable that the other end of the sixth region 151*f* is located inside the second region 121*b*.

Here, the plasma may be generated in the second region 121*b* of the first body 121 by a voltage applied to the conductive member 123 of the first electrode part 120 and a voltage applied to the other end of the second electrode part 150.

Through this, the plasma may be stably generated inside the insulating body 121 of the first electrode part 120, and in the stable plasma generation, when the plasma is applied for treatment, a plasma flame is not emitted to the outside so that a risk of burns or external injury is low, and an electric spark is not generated so that the plasm can be directly applied to skin treatment, whitening treatment, dental treatment, or external injury treatment.

Meanwhile, the second region 121b of the first body 121 may have a first length L1, and the other end of the sixth region 151f may have a second length L2 from a boundary between the first region 121a and the second region 121b of the first body 121. Here, the first length L1 may be the same as the length of the second conductive member 123b.

The second length L2 may have a range of 0% to 100% compared to the first length L1. It is preferable that the second length L2 is in a range of 25% to 70% of the first length L1, and it is most preferable that the second length L2 is 50% of the first length L1.

Here, when the second length L2 is less than 25% of the first length L1, when an edge end of the second electrode part 150 is located on the right side by a set value (25%) or more with respect to FIG. 8 within a range of the second conductive member 123b, as a result, a discharge start voltage that is a plasma generation start voltage may become higher due to an effect of increasing the distance between the electrodes, but an electric field is distributed between coated electrodes of the second conductive member 123b at the edge end of the second electrode part 150 to generate the plasma. When the second length L2 is greater than 75% of the first length L1, since a length at which the electric field may be distributed between the coated electrodes of the second conductive member 123b at the edge end is shortened, an edge effect becomes insignificant, and thus a plasma generation efficiency is reduced.

However, in some case, when the above-described problems do not occur or are not taken into account, the second length L2 may have a range of 0% to 25% or 75% to 100% of the first length L1.

It is preferable that, in the insertion hole 122, a separation distance between the second electrode part 150 and the first electrode part 120 is in a range of 0.1 to 10 mm.

Due to this separation space, the intensity of the plasma may be suitable for a small chamber, a plasma generation temperature may not be high, and a path through which a gas injected from one side moves may be provided.

Meanwhile, when the separation distance is 0.1 mm or less, the intensity of the plasma is small, and the plasma gas cannot be easily ejected.

Further, when the separation distance is greater than 10 mm, it is difficult to generate the plasma, and when the plasma is generated, an electric spark occurs, a capacity of the power supply source should be increased, the plasma treatment apparatus cannot be used for a long time due to a high damage rate of a central electrode, stability of the overall components cannot be secured due to a high temperature, and the plasma treatment apparatus deviates from the scope of the present invention.

The sealing member 160 is made of an insulating rubber material and is disposed between one end of the first electrode part 120 and the flange 151d of the second electrode part 150 to prevent a gas from being discharged to the one side of the insertion hole 122 of the first electrode part 120.

Further, the sealing member 160 may prevent external air from flowing into one side of the insertion hole 122 of the first electrode part 120 to prevent ozone from being generated in the generated plasma gas.

Meanwhile, in another embodiment of the present invention, it is also possible to bond the first electrode part 120 and the second electrode part 150 with an adhesive or the like without using the sealing member 160.

Meanwhile, as the second terminal 170 is fastened to the holder 140, the flange 151d of the second electrode part 150 may be pressed in the other direction, and as the flange 151d is pressed in the other direction, the sealing member 160 may be compressed between the one end of the first electrode part 120 and the flange 151d of the second electrode part 150 to improve sealing performance.

The sealing member 160 may include a catching part 161, a protrusion 162, and a through-hole 163.

The catching part 161 may be located on one side of the sealing member 160, may be in contact with the other surface of the flange 151d, and may have the same diameter as the flange 151d.

The protrusion 162 may be located on the other side of the catching part 161, may have a smaller diameter than the catching part 161, and may have an outer circumferential surface corresponding to the catching region 141b of the holder 140.

The through-hole 163 may pass through the insides of the protrusion 162 and the catching part 161, and a partial region of the fifth region 151e of the second electrode part 150 not inserted into the insertion hole 122 may be inserted into the through-hole 163.

The second terminal 170 may be fastened to the fastening part 142 of the holder 140, prevent the plurality of second electrode parts 150 from being separated to one side, and electrically connect the plurality of second electrode parts 150 in parallel.

The second terminal 170 may include the terminal hole 171 in which the second electrode part 150 is fitted and a fastening hole 172 to be fastened to the holder 140.

Here, a second voltage (for example, – voltage) may be applied to the second terminal 170.

Meanwhile, the inner diameter of the terminal hole 171 corresponds to the diameter of the third region 151c and is smaller than the diameter of the fourth region 151d, and thus, when the second terminal 170 is fastened to the fastening part 142 of the holder 140, the second terminal 170 may transmit an applied voltage while in contact with the third region 151c and the fourth region 151d.

Further, the inner diameter of the terminal hole 171 is smaller than the diameter of the fourth region 151d, and when the second terminal 170 is fastened to the fastening part 142 of the holder 140, the second terminal 170 may press the flange 151d in the other direction.

The fastening hole 172 may correspond to a fastening hole of the fastening part 142 and may be fastened through a bolt or the like.

Meanwhile, the fastening part 142 may include a screw hole (not illustrated) having a screw thread therein, passing through one side and the other side thereof, and having a screw thread on an inner circumferential surface thereof.

Here, in the screw hole of the fastening part 142, a first bolt (not illustrated) for fastening the first terminal 130 may be fastened to the other side thereof, and a second bolt (not illustrated) for fastening the second terminal 170 may be fastened to one side opposite thereto. That is, the first bolt and the second bolt may be fastened to face each other in the screw hole of the fastening part 142.

The above detailed description exemplifies the present invention. Furthermore, the above-mentioned contents describe the exemplary embodiment of the present invention, and the present invention may be used in various other combinations, changes, and environments. That is, the present invention can be modified and corrected without departing from the scope of the present invention that is disclosed in the specification, the equivalent scope to the written disclosures, and/or the technical or knowledge range of those skilled in the art. The written embodiment describes the best state for implementing the technical spirit of the present invention, and various changes required in the detailed application fields and purposes of the present invention can be made. Accordingly, the detailed description of the present invention is not intended to restrict the present invention in the disclosed embodiment state. Furthermore, it should be construed that the attached claims include other embodiments.

The invention claimed is:

1. A plasma generation unit comprising:
   a first electrode part that includes an insulating body having an insertion hole therein and being made of an insulating material and a conductive member disposed on an outer circumferential surface of the insulating body; and
   a second electrode part that has a gas injection hole communicating with a distal end region thereof, has a proximal end region inserted into the insertion hole of the first electrode part, and has a conductive property,
   wherein the proximal end region of the second electrode part has a diameter that is decreased toward an end of the proximal end region and is located to correspond to an arrangement region of the conductive member.

2. The plasma generation unit of claim 1, wherein the insulating body includes an electrode region located on one side thereof and a stepped region located on the other side of the electrode region, having a step with the electrode region, and having an expanded diameter, and
   the conductive member is disposed on an outer circumferential surface of the electrode region and a stepped surface of the stepped region forming a step with the electrode region.

3. The plasma generation unit of claim 2, wherein the conductive member includes a first conductive member disposed on the stepped surface and a second conductive member disposed on the outer circumferential surface of the electrode region and electrically connected to the first conductive member.

4. The plasma generation unit of claim 3, wherein the proximal end region of the second electrode part is located inside the electrode region.

5. The plasma generation unit of claim 3, further comprising:
   a first terminal electrically connected to the conductive member of the first electrode part; and
   a second terminal electrically connected to the second electrode part.

6. The plasma generation unit of claim 5, wherein the first terminal is in contact with the first conductive member and is spaced apart from the second conductive member.

7. The plasma generation unit of claim 2, wherein a gas discharge hole communicating with the gas injection hole is formed in an outer circumferential surface of the second electrode part, and
   the gas discharge hole communicates with the insertion hole.

8. The plasma generation unit of claim 1, wherein the proximal end region of the second electrode part has a conical shape.

9. The plasma generation unit of claim 1, wherein the second electrode part includes a flange having an expanded diameter between the distal end region and the proximal end region, and the plasma generation unit further includes a sealing member disposed between the flange and a distal end of the insulating body.

10. A plasma treatment apparatus comprising: a base; at least two plasma generation units each including; a first electrode part that includes an insulating body having an insertion hole therein and being made of an insulating material and a conductive member disposed on an outer circumferential surface of the insulating body; and a second electrode part that has a gas injection hole communicating with a distal end region thereof, has a proximal end region inserted into the insertion hole of the first electrode part, and has a conductive property, the at least two plasma generation units being fixed to the base; a first terminal that connects the conductive members of the at least two plasma generation units in parallel and is fastened to the base to prevent separation of the first electrode part; a holder that is fastened to the first terminal, and covers the first electrode part and exposes the distal end region of the second electrode part in each of the at least two plasma generation units; and a second terminal that connects the second electrode parts of the at least two plasma generation units in parallel and is fastened to the holder to prevent separation of the second electrode part, wherein in each of the at least two plasma generation units, the proximal end region of the second electrode part has a diameter that is decreased toward an end of the proximal end region and is located to correspond to an arrangement region of the conductive member.

11. The plasma treatment apparatus of claim 10, wherein in each of the at least two plasma generation units, the holder allows a central line of the insertion hole and a central line of the second electrode part to coincide with each other and spaces an outer circumferential surface of the second electrode part inserted into the insertion hole and an inner circumferential surface of the first electrode part apart from each other.

12. The plasma treatment apparatus of claim 10, wherein in each of the at least two plasma generation units,
   the insulating body includes an electrode region located on one side thereof and a stepped region located on the other side of the electrode region, having a step with the electrode region, and having an expanded diameter, and
   the conductive member includes a first conductive member disposed on a stepped surface of the stepped region forming the step with the electrode region and a second conductive member disposed on an outer circumferential surface of the electrode region and electrically connected to the first conductive member.

13. The plasma treatment apparatus of claim 12, wherein the proximal end region of the second electrode part is located inside the electrode region.

14. The plasma treatment apparatus of claim 12, wherein the first terminal is in contact with the first conductive member and is spaced apart from the second conductive member.

15. The plasma treatment apparatus of claim 10, wherein in each of the at least two plasma generation units, the second electrode part includes a flange having an expanded diameter between the distal end region and the proximal end region, and each of the at least two plasma generation units further includes a sealing member disposed between the flange and a distal end of the insulating body.

* * * * *